(12) United States Patent
Fukushima et al.

(10) Patent No.: US 7,288,173 B2
(45) Date of Patent: Oct. 30, 2007

(54) ION BEAM PROCESSING SYSTEM AND ION BEAM PROCESSING METHOD

(75) Inventors: Akio Fukushima, Ibaraki (JP); Kojiro Yagami, Miyagi (JP)

(73) Assignees: Sony Corporation, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 72 days.

(21) Appl. No.: 10/928,832

(22) Filed: Aug. 27, 2004

(65) Prior Publication Data

US 2005/0092432 A1     May 5, 2005

(30) Foreign Application Priority Data

Oct. 31, 2003    (JP)   ............... 2003-373365

(51) Int. Cl.
    *C23C 14/34*     (2006.01)
(52) U.S. Cl. ............... 204/298.36; 204/298.34; 156/345.39
(58) Field of Classification Search ......... 204/298.34, 204/298.36; 156/345.39; 216/66; 250/492.2, 250/492.21, 492.3
See application file for complete search history.

(56) References Cited

U.S. PATENT DOCUMENTS 3,534,385 A * 10/1970 Bernheim et al. ...... 219/121.19
4,457,803 A * 7/1984 Takigawa ............ 204/192.33

FOREIGN PATENT DOCUMENTS

JP    06-293967    * 10/1994
JP    11-2890580    10/1999

OTHER PUBLICATIONS

Hiroshi Gokan, et al., Fine Pattern Fabrication by Ion-beam Etching, Vacuum, vol. 20, No. 11, pp. 17-25, 1977.
Per G. Gloersen, Ion-beam etching, J. Vac. Sci. Techn. vol. 12, No. 1, pp. 28-35, 1975.

* cited by examiner

*Primary Examiner*—Rodney G. McDonald
(74) *Attorney, Agent, or Firm*—Sonnenschein Nath & Rosenthal LLP

(57) ABSTRACT

An ion beam processing system emitting an ion beam at a workpiece to process the workpiece, provided with an electrode for applying an electric field to the workpiece, the potential of the electrode being made 0V or a negative potential, and a cover insulated from the electrode arranged at an ion beam incidence side of the electrode, thereby preventing or suppressing sputtered particles from redepositing on a master pattern and the processed surface to form burrs, and an ion beam processing method used with the same.

4 Claims, 17 Drawing Sheets

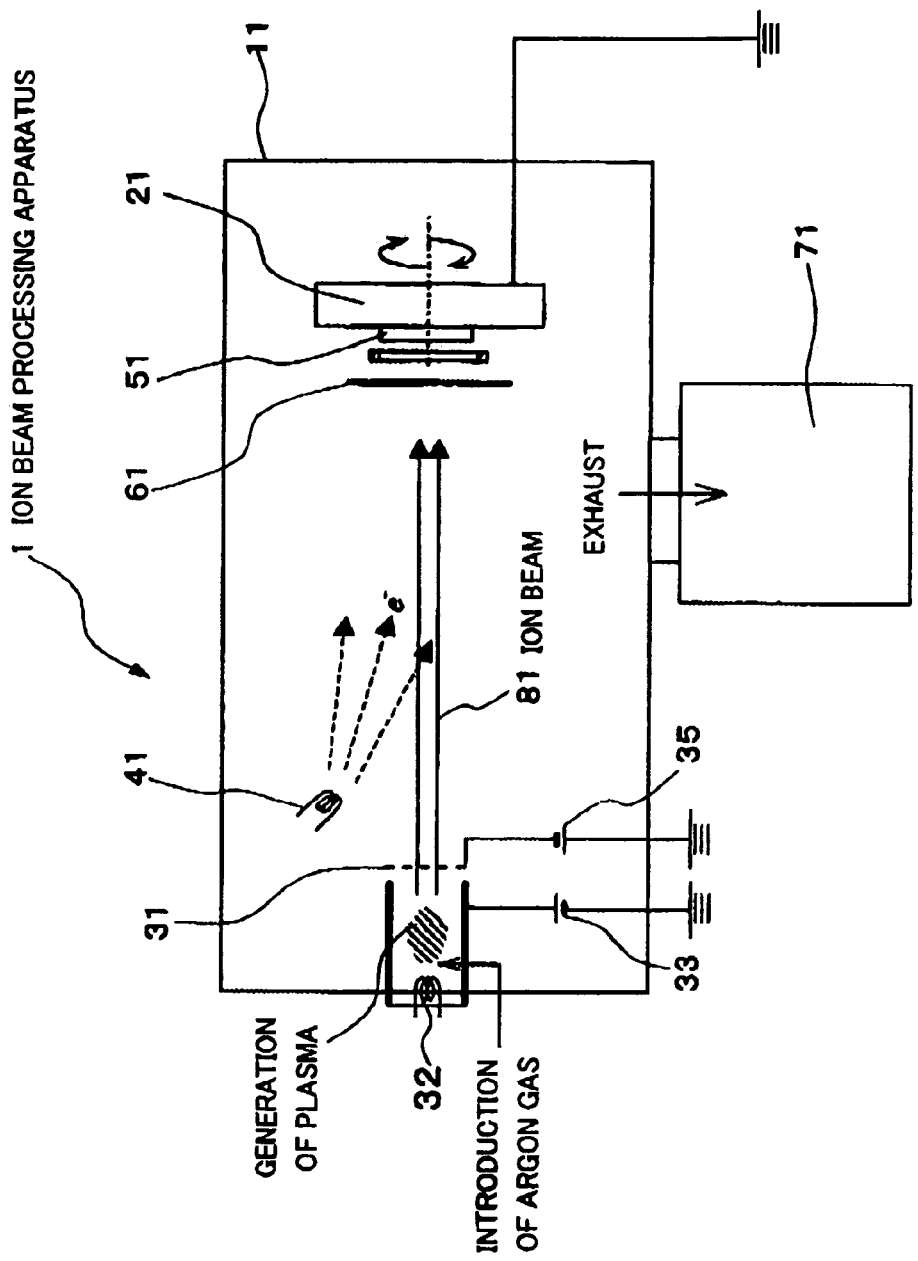

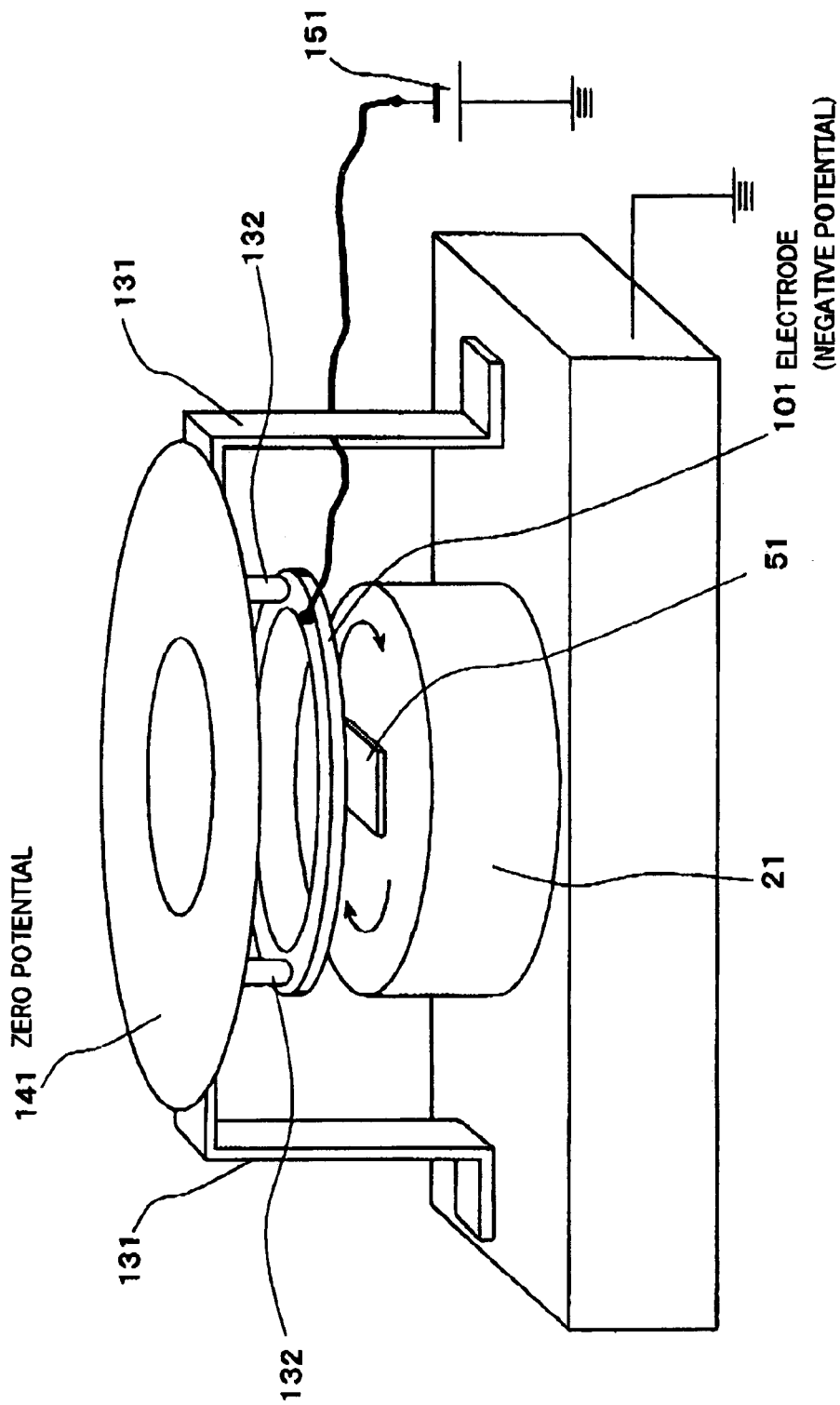

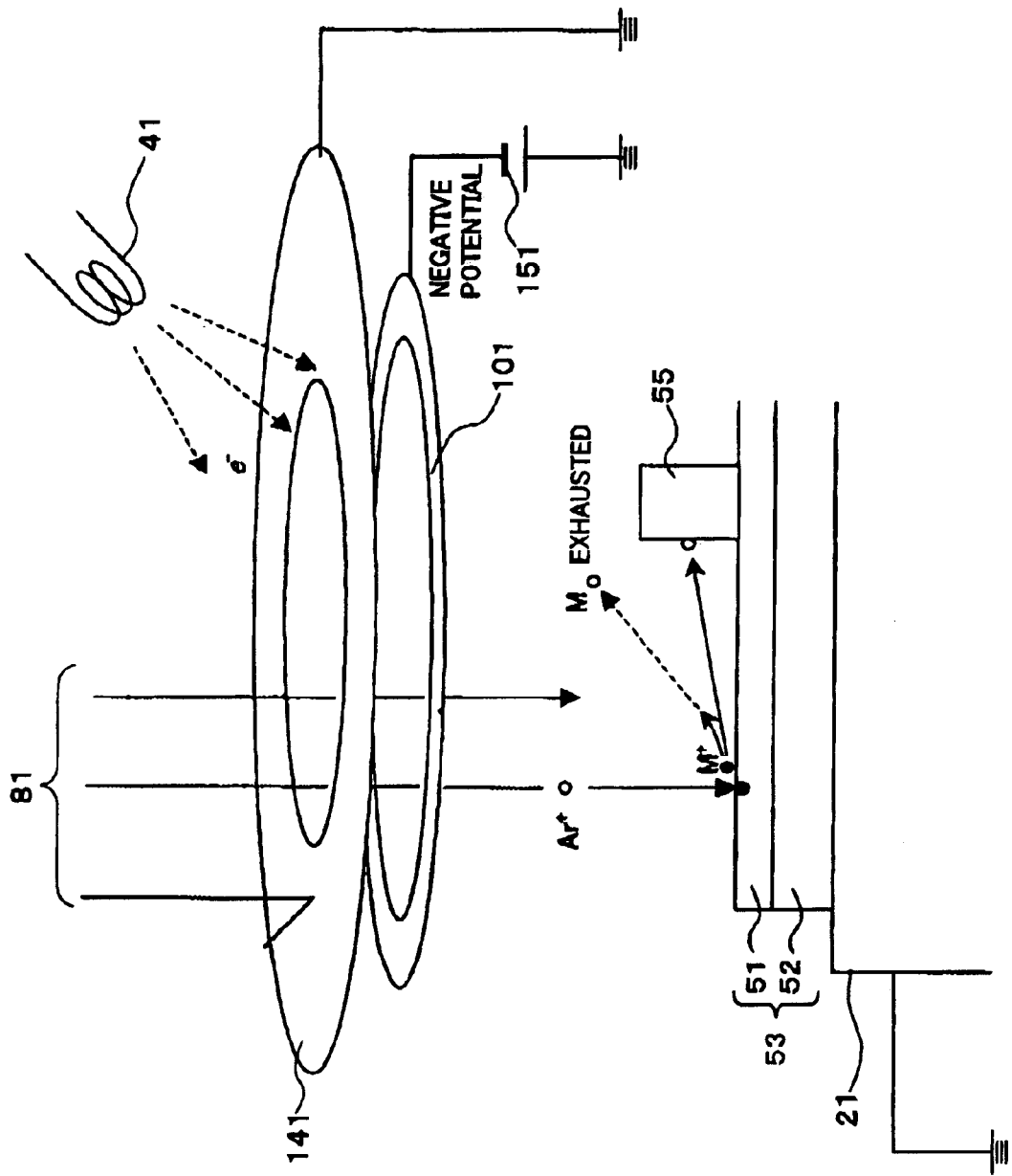

HEIGHT OF BURR (100nm/div.)

PATTERN WIDTH (μm)

BURR
200nm

BURR
LESS THAN 60nm

NO ELECTRODE
BURR'S HEIGHT
UP TO 200 nm

ELECTRODE POTENTIAL
0V
BURR'S HEIGHT
UP TO 180 nm

ELECTRODE POTENTIAL
-50V
BURR'S HEIGHT
50 nm TO 70 nm

ELECTRODE POTENTIAL
-100V
BURR'S HEIGHT
90 nm TO 150 nm

ELECTRODE POTENTIAL
-300V
BURR'S HEIGHT
70 nm TO 90 nm

ELECTRODE POTENTIAL
-500V
BURR'S HEIGHT
70 nm TO 90 nm

ION BEAM PROCESSING SYSTEM AND ION BEAM PROCESSING METHOD

RELATED APPLICATION DATA

The present application claims priority to Japanese Application(s) No(s). P2003-373365 filed Oct. 31, 2003, which application(s) is/are incorporated herein by reference to the extent permitted by law.

BACKGROUND OF THE INVENTION

1. Field of Invention

The present invention relates to an ion beam processing (milling) system and ion beam processing (milling) method, enabling the prevention of redeposition of sputtered particles on a mask pattern and processed surface.

2. Description of the Related Art

As a technique for microprocessing a thin film, a beam processing is known. This beam processing is a processing method emitting (or exposing) an argon (Ar) beam or other beam on a sample at a high speed so as to shave off parts of the sample surface. As that beam processing, ion milling using Ar ions, reactive ion etching (RIE) using also chemical reactions, etc. are known.

Ion milling will be explained briefly first using FIGS. 1A to 1C.

As shown in FIG. 1A, usually a sample 301 to be processed, for example, a thin film 302 formed on the surface of a substrate, is formed with fine mask patterns 305 using a suitable resist film or inorganic material film. Next, as shown in FIG. 1B, the sample (thin film) 302 is irradiated by an argon ion beam 311 so as to etch (mill) the surface of the sample (thin film) 302 not covered by the mask patterns 305. As a result, the mask patterns 305 are transferred to the thin film 302 surface.

The problem here in that, as shown in FIG. 1C, at the time of milling, the atoms 30A at the sputtered sample surface redeposit on the aide faces of the mask patterns 305 (see FIG. 1B) and side faces of the processed parts to form so-called "burr" 321. Milled surfaces are generally cut at a slant, so the burrs 321 also deposit along those shapes. After removal of the mask patterns 305, the sectional shapes remaining resemble the floppy ears of rabbits, so are also called as "rabbit ears". The heights of the burrs 321 reach as much as the thicknesses of the mask patterns 305 depending on the milling conditions. They are also not necessarily proportional to the milling amounts. With even a slight milling depth, for example, about 20 nm, burrs often become extremely great in height, for example, 100 to 200 nm. These burrs 321 deposit at the side faces of the processed surfaces, so when etching a multilayer film, easily cause interlayer short-circuits and cause the inherent functions of the device to be lost, for example, see Japanese Unexamined Patent Publication (Kokai) No. 11-289058; Hiroshi GOHEI and Sotaro EISHO ed., Vacuum, vol. 20, no. 11, p. 17 to 25, 1977 (in Japanese); and Per G. Gloersen ed., *J. Vac. Sci. Technol.*, vol. 12, no. 1, p. 28 to 35, 1975.

For example, frequent use is made of the process of using a resist for a mask pattern and burying it with an insulating film 331 as shown as FIG. 2A, then lifting it off as shown in FIG. 2B. In this case, if a burr 321 covers the side faces of the mask pattern 305, peeling off the mask pattern 305 will become difficult. That is, liftoff will become difficult.

Further, as shown in the top view of FIG. 3A and the sectional view of FIG. 3B, the burr 321 grows slanted inward, so residue 333 of the resist easily occurs at the root part. A contact hole is formed on the top surface of the device by liftoff, but the size of the opening will end up becoming smaller than the design size due to the burr 321. If the size of the device is on the submicron order, the ratio of the burr 321 in the contact hole part will become remarkably high and make formation of an opening difficult. The occurrence of burrs 321 becomes more remarkable the smaller the mask size. The height and thickness of the burrs increase. Further, at the time of liftoff or peeling of a mask pattern, the percentage of a burr 321 removed together with the mask pattern will also drop. Therefore, the damage caused by the burr 321 becomes more remarkable the smaller the device size.

As explained above, in the ion milling of the related art, due to burrs formed at the timing of milling (redeposition of sputtered particles), the microprocessing capability was limited. It is becoming difficult to answer the demands for further miniaturization to the submicron and nanometer (mm) order required for future production of semiconductor devices, micro electro mechanical systems (HEMS), etc.

As one means for dealing with this, use has been made of the technique of removing burrs formed while milling a sample surface by exposing an ion beam on the sample surface at a slanted direction (direction inclined tens of degrees from direction perpendicular to sample surface), but the effect of removal is small. Further, the problem arises of increased tapering at the cross-sectional profile of the milling.

SUMMARY OF THE INVENTION

An object of the present invention is to provide an ion beam processing (milling) system and ion beam processing (milling) method preventing or suppressing sputtered particles from redepositing on a mask pattern and processed surface to form burrs.

According to a first aspect of the invention, there is provided an ion beam processing system emitting an ion beam to a processed sample to process the processed sample, provided with an electrode for applying an electric field to the processed sample.

Preferably, a potential of the electrode is a negative potential or 0V.

Preferably, the electrode is arranged at one of a position of above the processed sample, at the sides of the processed sample, and below the processed sample.

Preferably, a cover insulated from the electrode is arranged at an ion beam incidence side of the electrode.

The ion beam processing system of the present invention is provided with an electrode for applying an electric field to the processed sample, so the atoms (particles) of the processed sample sputtered and made positive (+) ions by the ion beam at the time or ion beam processing are deflected in trajectory of emission by the action of the electric field generated between the electrode and the processed sample to the direction of incidence of the ion beam on the processed sample surface. Therefore, atoms (particles) which had struck the mask used at the time of ion beam processing in the related art no longer strike it and as a result there is the advantage that occurrence of burrs at mask side walls can be suppressed.

According to a second aspect of the invention, there is provided an ion beam processing method emitting an ion beam to a processed sample to process the processed sample, comprising applying an electric field to the processed sample at the time of ion beam processing.

Preferably, an electrode is used to apply the electric field to the processed sample.

Preferably, a potential of the electrode is a negative potential or 0V.

Preferably, the method further comprises arranging a cover insulated from the electrode at an ion beam incidence side when making the potential of the electrode a negative potential.

The ion beam processing method of the present invention is to generate an electric field at the processed sample at the time of ion beam processing, so the atoms (particles) of the processed sample sputtered and made positive (+) ions by the ion beam at the time or ion beam processing are deflected in trajectory of emission by the action of the electric field generated between the electrode and the processed sample to the direction of incidence of the ion beam on the processed sample surface. Therefore, atoms (particles) which had struck the mask used at the time of ion beam processing in the related art no longer strike it and an a result there is the advantage that occurrence of burrs at mask side walls can be suppressed.

According, according to the ion beam processing system and ion beam processing method of the present invention, since formation of burrs depositing around masks in ion milling or reactive ion etching (RIE) accompanied with physical sputtering effects is prevented, there are the effects that (1) short-circuits between multilayer films after processing due to occurrence of burrs can be suppressed, (2) the side faces of the resist mask are not covered by redeposits (burrs) and therefore liftoff can be remarkably improved, (3) residual resist easily occurring at the roots of the burrs can be eliminated, (4) sizes of openings of contact holes can be obtained as designed even in microdevices, (S) burrs do not grow even with miniaturization of mask size, so processing of microshapes of the submicron order is possible, (6) there is no need to tilt the sample surface for ion beam processing to remove burrs, so tapering of the processed sectional profile can be suppressed, etc.

BRIEF DESCRIPTION OF THE DRAWINGS

These and other objects and features of the present invention will become clearer from the following description of the preferred embodiments given with reference to the attached drawings, wherein:

FIG. 4 is a view of the general configuration of an ion beam processing system and ion bean processing method according to embodiments of the present invention;

FIG. 5 is perspective view of principal parts of an ion beam processing system of the present invention;

FIG. 6 is a view of the principal configuration for explaining the operation of an ion beam processing system of the present invention;

DESCRIPTION OF THE PREFERRED EMBODIMENTS

Figure 1A:
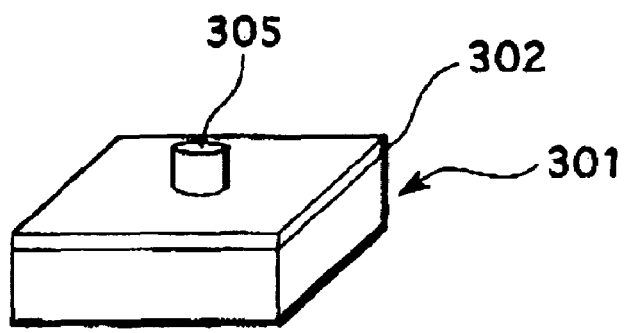
FIGS. 1A to 1C are views for explaining ion milling of the related art.
Figure 1B:
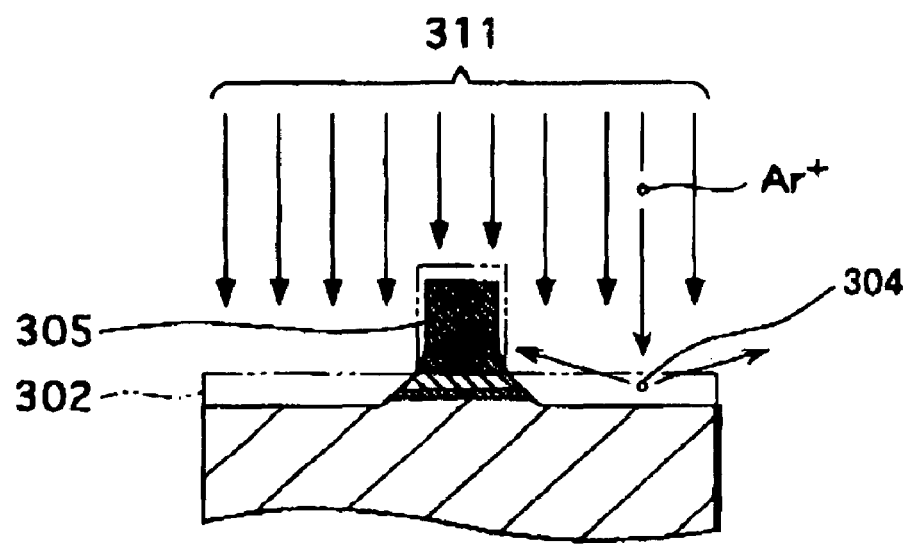
Figure 1C:
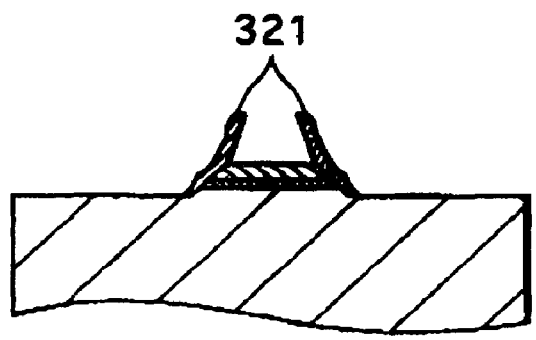
Figure 2A:
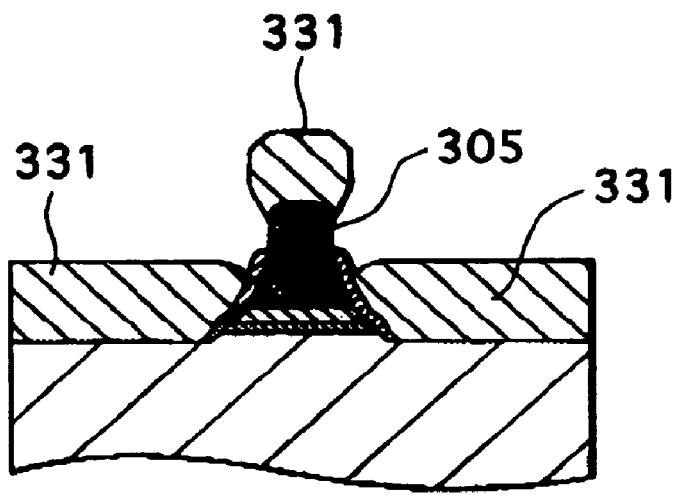
FIGS. 2A and 2B are views for explaining problems in the lift-off method in ion milling of the related art.
Figure 2B:
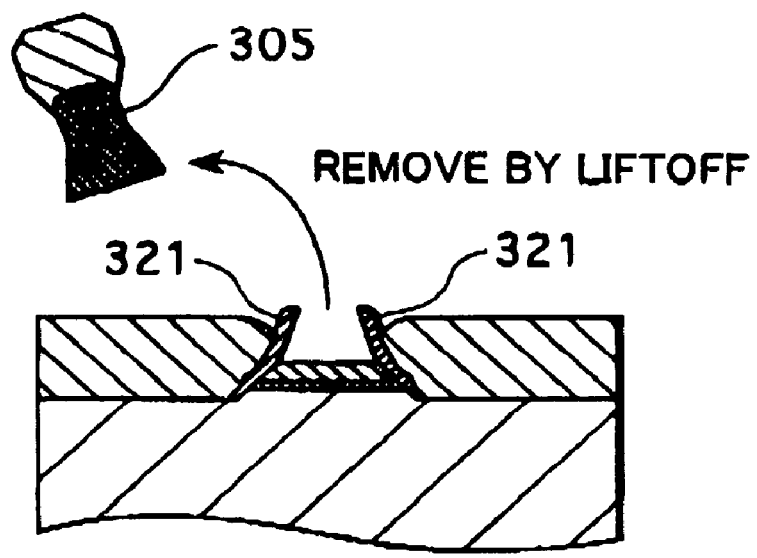
Figure 3A:
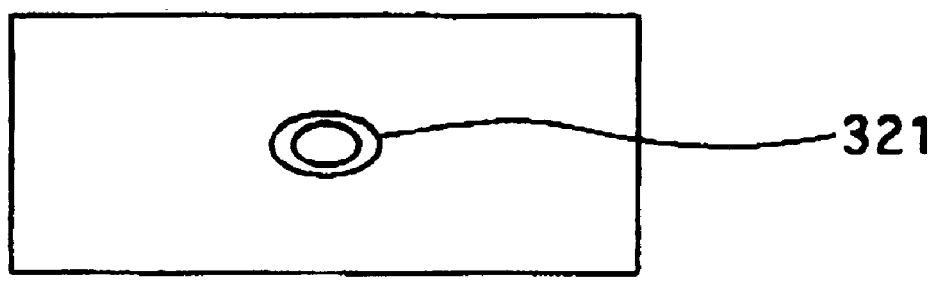
FIGS. 3A and 3B are views for explaining problems in the lift of method in ion milling of the related art.
Figure 3B:
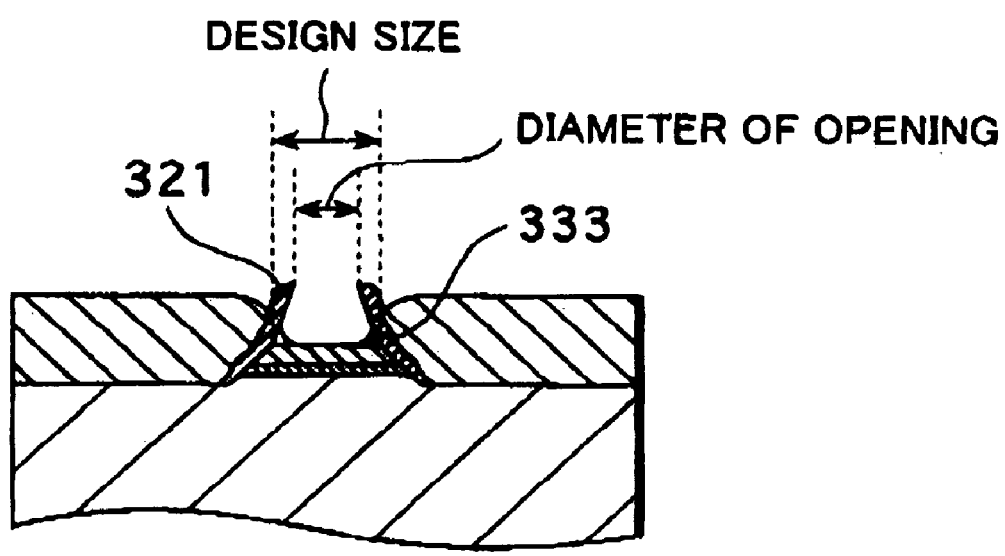

Preferred embodiments of the present invention will be described in detail below with reference to the attached drawings.

To prevent redeposition of sputter atoms on the sample surface at the time of ion beam processing, an electrode for generating an electric field and having 0 potential or a negative potential is provided in the space above the processed surface of the processed sample. This deflects the direction of emission of the atoms from the sample surface sputtered by the processing and prevents the sputtered atoms from redepositing on the sample surface.

First Embodiment

An ion beam processing system and ion beam processing method according to a first embodiment of the present invention will be described with reference to the schematic view of the configuration of FIG. 4, the perspective view of principal parts of FIG. 5, the view of the configuration of principal parts for explaining the operation of FIG. 6, etc. There are various types of ion beam processing systems, but in FIG. 4, an example of application of the present invention to a general ion beam processing system will be shown.

As shown in FIG. 4, the ion beam processing system 1 is provided with a vacuum chamber 11. The vacuum chamber 11 is provided inside it with a stage 21 for holding a processed sample 51. This stage 21 is designed to rotate by a not shown rotational drive device.

The vacuum chamber 11 also has arranged inside it an ion source 31 facing the processed surface of the processed sample 51 held at the stage 21. This ion source 31 for example converts introduced argon (Ar) gas to a plasma by a filament 42 and emits argon ions. The anode of the ion source 31 is supplied with voltage of for example +300V from a power source 33. The ion source 31 is also provided at the ion beam emission side with a grid 34 for accelerating the ions. This grid 34 has a power source 35 connected to it. This power source 35 supplies the grid 34 with a negative voltage of for example −50V. Further, an electron generator (neutralizer) 41 for emitting electrons for neutralization toward the surface of the processed sample 34 is provided in the vacuum chamber 11. For this electron generator, for example a filament for generating hot electrons is used. Further, a shutter 61 is provided between the ion source 41 and processed sample 51 to be able to block the ion beam. Further, as a means for applying an electric field near the processed surface of the processed sample 51, an electrode 101 is provided at the ion beam incidence side of the processed sample for example. This electrode 101 is set to a negative potential or 0 potential.

Further, the vacuum chamber 11 has a vacuum evacuation pump 71 connected to it. This vacuum evacuation pump 71 is designed to be able to exhaust the gas inside the vacuum chamber 11.

The ion beam processing system 1 ionizes the argon (Ar) gas by the ion source 31, accelerates the resultant ionized gas at the grid 34 by applying voltage, and makes it strike the processed sample 51 as an ion beam 81. At this time, the electron generator 41 provided near the ion source 31 emits electrons and neutralizes the ion beam 81 after acceleration and the processed surface of the processed sample 51 charged during the ion milling. The incidence angle of the ion beam 81 to the processed surface sample is suitably determined in accordance with the objective. Normally, the incident angle is in the range of 0 degree to several tons of degrees.

Next, an example of the arrangement of the electrode 101 will be described with reference to FIG. 5.

As shown in FIG. 5, for the electrode 101, for example, a ring-like copper plate is used. This is made a size of for example an outside diameter of 50 mm, an inside diameter of 37 mm, and a thickness of 1.5 mm. A processed sample 51, for example, a 20 mm×20 mm square substrate, is placed on the stage 21. To maintain electric insulation between the processed sample 51 and the system proper, the electrode 101 is arranged above the processed sample 51 in parallel to the surface of the processed sample 51. For example, a holding mechanism 131 provided at the system proper, for example the vacuum chamber 11, is used to support a later explained cover 141, and this cover 141 is provided with the electrode 101 through insulators 132. At this time, the processed sample 51 and the electrode 101 are aligned in center axes. The distance between the electrode 101 and the processed sample 51 is suitably determined so that no electrodischarge will occur between the two and so as to give an electric field intensity whereby the trajectory of the particles sputtered and ionized from the sample surface can be sufficiently bent to the argon ion beam incidence direction. While depending on the voltage applied to the electrode 101 as well, the distance is for example 6 mm to 8 mm. The above numerical values should be suitably determined in accordance with the processed surface area, the thickness of the resist film (mask) formed on the processed surface of the processed sample 51, the planar size of the mask, the magnitude of the voltage applied to the electrode 101, etc.

Further, the electrode 101 is connected to a power source 151 so as to make the electrode 101 a negative potential. This power source 151 applies a voltage not causing electrodischarge between the electrode 101 and the processed sample 51. For example, it applies a voltage of—several volts to −500V to the electrode 101. Alternatively, the electrode 101 can be a zero potential, i.e., the electrode 101 is grounded. Even when is grounded, at the time of ion beam processing, the surface of the processed sample 51 is charged positively, though slightly, so it is possible to obtain a similar effect as when the electrode 101 is applied with a negative potential and deposition of ions on the mask can be prevented or suppressed.

The grounded cover 141 is provided above the electrode 101 (ion beam incidence side) to prevent the ion beam (not shown) from directly striking the electrode 101. When the cover 141 is not provided, problems arise such as (1) the negative potential electrode 101 ending up absorbing the positively charged ion beam and therefore the amount of the ion beam contributing to the milling being reduced, (2) as a result, Joule's heat being produced and the electrode 101 ending up being heated, for example, with 300V and 10 mA, 3W, and (3) the ion beam current, for example, several mA to hundred mA, flowing into the power source 151 for applying voltage to the electrode 101 and therefore the load of the power source 151 increasing. The cover 141 is arranged insulated from the electrode 101. For example, the cover 141 is arranged across from the electrode 101 through the insulators 132. The material of the cover 141 may be any metal with conductivity, such as aluminum. The inside diameter of the cover 141 is larger than the size of the processed sample 51 so that the cover 141 does not block the processed sample 51 from being irradiated by the ion beam and is made a value smaller than the inside diameter of the electrode 101. Note that when the electrode 101 is in a zero potential, the cover 141 need not be provided. Further, the cover 141 in preferably grounded. The stage 21 is also grounded.

Next, the operation of the part of the ion beam processing system relating to the present invention, that is, the ion beam processing method, will be explained with reference to the perspective view of the principal parts of the ion beam processing system of FIG. 6.

As shown in FIG. 6, in the ion beam processing system 1, an ion beam 81, for example, an argon (Ar+) ion beam, emitted from the ion source 31 and accelerated by the grid 34 is exposed on the processed surface of the processed sample 51, whereby the thin film 53, for example, metal thin film, metal compound thin film, etc., formed on the surface of the substrate 52 of the processed sample 51 held on the stage 21 is milled.

At this time, the thin film atoms sputtered from the sample surface by the ion beam become +ions M+ right after sputtering, so are bent in trajectory of emission by the action of the electric field generated by the electrode 101 to a direction perpendicular to the thin film surface. Therefore, the sputtered atoms are exhausted without redepositing on the mask 55. At this time, the electron generator 41 is continuously supplying electrons to the surface of the processed sample 51, so the sputtered flying (scattering) +ions M+ end up to be electrically neutralized and then become atoms (particles) M not affected by the electric field. Further, the neutralized atoms (particles) M spread through the inside of the vacuum chamber (see FIG. 4) and are exhausted by the vacuum evacuation device (see FIG. 4) to the outside of the vacuum chamber. If the electrode 101 were not provided at the ion beam processing system, most of the sputtered flying (scattering) +ions M+ would be neutralized, then strike the side walls of the mask 55 and deposit there to form burrs.

Accordingly, when performing processing by the ion beam processing system 1 of the present invention, occurrence of burrs formed due to redeposition of sputter atoms at the mask 55 formed on the thin film 53 of the processed sample 51 is prevented or growth of the burrs is suppressed and reduced. Further, the ion beam incidence side of the electrode 101 is provided with a cover 141 electrically insulated from the electrode 101, so the electrode 101 will not directly be exposed to the ion beam 61. Therefore, the ion beam 81 is prevented from striking the electrode 101.

Next, an example of use of the ion beam processing system 1 for processing of the processed sample 51 will be explained.

Figure 7:
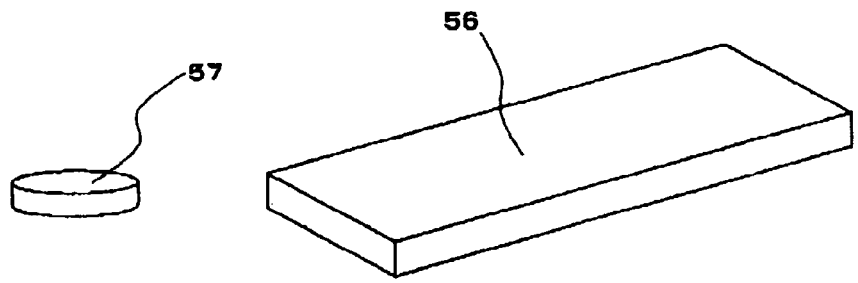
FIG. 7 is a perspective view for explaining an example of resist masks.

As the processed sample 51, a substrate, for example, thermal oxidized Si wafer, formed with a suitable metal film, then formed with resist master patterns was prepared. The thickness of the resist was for example made a thickness enabling easy formation of micromasks of a size on the submicron order, for example, was made about 200 nm to 400 nm. As the resist masks, for example, as shown in FIG. 7, a plate-shaped pattern 56 of a width of 10 µm and a length of several hundred µm and a circular pattern 57 of a diameter of 1 µm were prepared. The metal film and substrate may be of any material and are suitably selected in accordance with the objective. Further, the potential of the surface of the processed sample 51 is not particularly prescribed.

A suitable voltage, while depending on the milling rate, for example about +300V, was supplied to the anode of the ion source 31 of the ion beam processing system 1 to generate Ar plasma. A voltage of for example −45V was applied to the grid 34 for extracting out the ions to form an argon (Ar+) ion beam 81. While operating the electron generator 41, the processed surface of the processed sample 51 was exposed to the ion beam 81 for milling. The ion beam current density was for example made 1.4 mA/cm². The amount of milling (etching depth) was made for example 20 nm to 100 nm. After milling, an organic solvent was used to dissolve away the resist. When resist remained, oxygen ($O_2$) ashing was performed. After this, the surface properties were measured by an atomic force microscope (AFM) to evaluate the state of occurrence of burrs.

Figure 8:
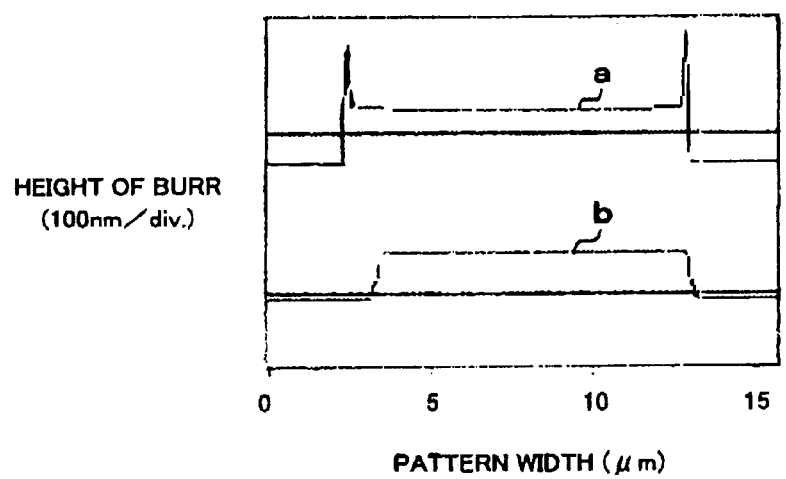
FIG. 8 is a view of the results of measurement of the height of burrs for explaining the effects of the present invention.

The results will be explained with reference to FIG. 8. FIG. 8 shows the difference in the state of occurrence of burrs when milling a pattern of a resist thickness of about 250 nm and a width of 10 µm in the case of application of voltage to the electrode (−300V/6 mm) and the case of not. The ordinate shows the height of the burrs, while the abscissa shows the pattern width.

The processed sample was made a silicon substrate formed on the surface with a thermal oxide film and formed on that surface with a metal film, for example, Cr: 20 nm/Au: 20 nm. When the amount of milling is 20 nm to 30 nm, with conventional milling by an ion beam processing system not provided with the electrode 101, as shown by a in FIG. 8, a burr with a height of 40 nm to 50 nm is clearly formed, while with an ion beam processing system of the present invention provided with the electrode 101, when applying a voltage or −300V to the electrode 101 to cause generation of an electric field, as shown in b of FIG. 8, there is almost no formation of a burr.

Further, with a 1 µm diameter pattern, the height of the burr formed in the case of no electric field was about 60 nm to 70 nm, but by generating an electric field in the same way as the above, there was almost no burr height.

The effects of the present invention do not depend on the material being milled. In the above example, the processed object was made the much used magnetic metal cobalt (Co), but substantially the same effect of suppression of burrs was obtained even when making this silicon oxide ($SiO_2$). In addition, while the milling rate changes, the effect of suppression of burrs of the present invention remained the same even with a precious metal such as gold (Au) or platinum (Pt), a high melting point metal such as chrome (Cr) or tungsten (W), or a metal oxide, for example, tantalum oxide ($Ta_2O_5$), aluminum oxide ($Al_2O_3$), etc.

When the amount of milling of the ion beam processing system 1 is large, the thickness of the resist mask must be made correspondingly greater. An example in the case of a circular mask (1 µm diameter) of a resist thickness of 350 nm will be explained next with reference to FIGS. 9A and 9B.

Figure 9A:
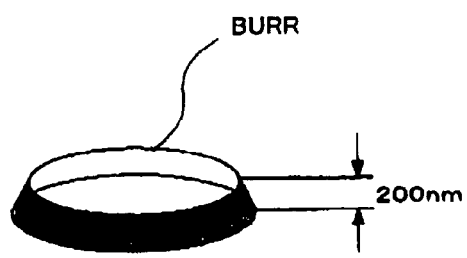
FIGS. 9A and 9B are schematic perspective views for explaining the shape of a burr.
Figure 9B:
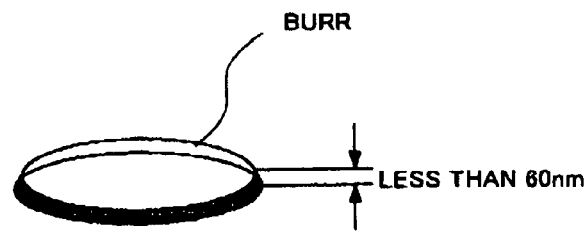

As shown in FIGS. 9A and 9B, the processed sample, in the same way as explained with reference to FIG. 8, is a silicon substrate formed on its surface with a thermal oxide film and formed on that surface with a metal film, for example, cobalt film, to a thickness of about 100 nm. When the amount of milling is about 100 nm, with conventional milling by an ion beam processing system not provided with the electrode 101, as shown in FIG. 9A, a burr of a height of about 200 nm was formed, but with the ion beam processing system of the present invention provided with the electrode 101, when applying a voltage forming an electric field of −5 to −100V/mm to the electrode 101, as shown in FIG. 9B, the burr height became about 60 nm or less. Compared with the case of no electrode 101, the height of the burr was greatly reduced. This extent of burr height is of a level not posing any practical problems even with liftoff using a resist mask.

The optimal value of the voltage applied to the electrode 101 in the ion beam processing system 1 of the present embodiment is suitably determined in the range of 0V to 1 kV. It is necessary to consider the distance between the electrode 101 and the processed surface of the processed sample. This distance is set so that no electrodischarge occurs between the electrode 101 and the processed sample 51. As the size of the field, about 200V/mm is made the upper limit. The optimal electric field intensity depends on the processed material and is related to the sputter rate, ionization rate, conductivity, dielectric constant, etc. of the material. Further, it may change depending on the thickness of the resist of the mask, the size of the mask, etc., so suitable consideration is required. Generally, however, −5V/nm to −100V/nun is preferable.

In the above embodiment, the electrode 101 was supplied with a negative potential, but sometimes the effect of suppression of burrs also arises with zero potential. This is because a spatial potential can be generated between the +ions of the sample ions flying (scattering) from the processed sample surface due to the milling and the electrode (zero potential). Further, the processed sample surface sputtered by the Ar+ ions due to the milling easily becomes positively (+) charged. While the electron generator (neutralizer) 41 emits electrons at the processed sample surface to neutralize it, the surface tends to be slightly positively (+) charged. Therefore, even when the electrode 101 is zero potential, sometimes an electric field is created with the processed sample surface.

Next, an example of overall evaluation of the effects of the present invention will be explained. Here, the state of occurrence of burrs when making the resist mask a plate-shaped pattern of a thickness of 250 nm and a width of 10 µm and milling a substrate, silicon oxide ($SiO_2$) film, formed on its outermost surface with a tantalum (Ta) film of a thickness of 5 nm was examined. The results will be explained with reference to FIG. 10. Note that the conventional ion beam processing conditions correspond to the "no electrode" column in the table. Here, "no electrode" means the state where the electrode is electrically floating (not grounded) or the state where no electrode is provided. Further, the tilt angle of the ion beam was made −5 degrees and the distance between the electrode and the processed sample was made 8 nm.

Figure 10:
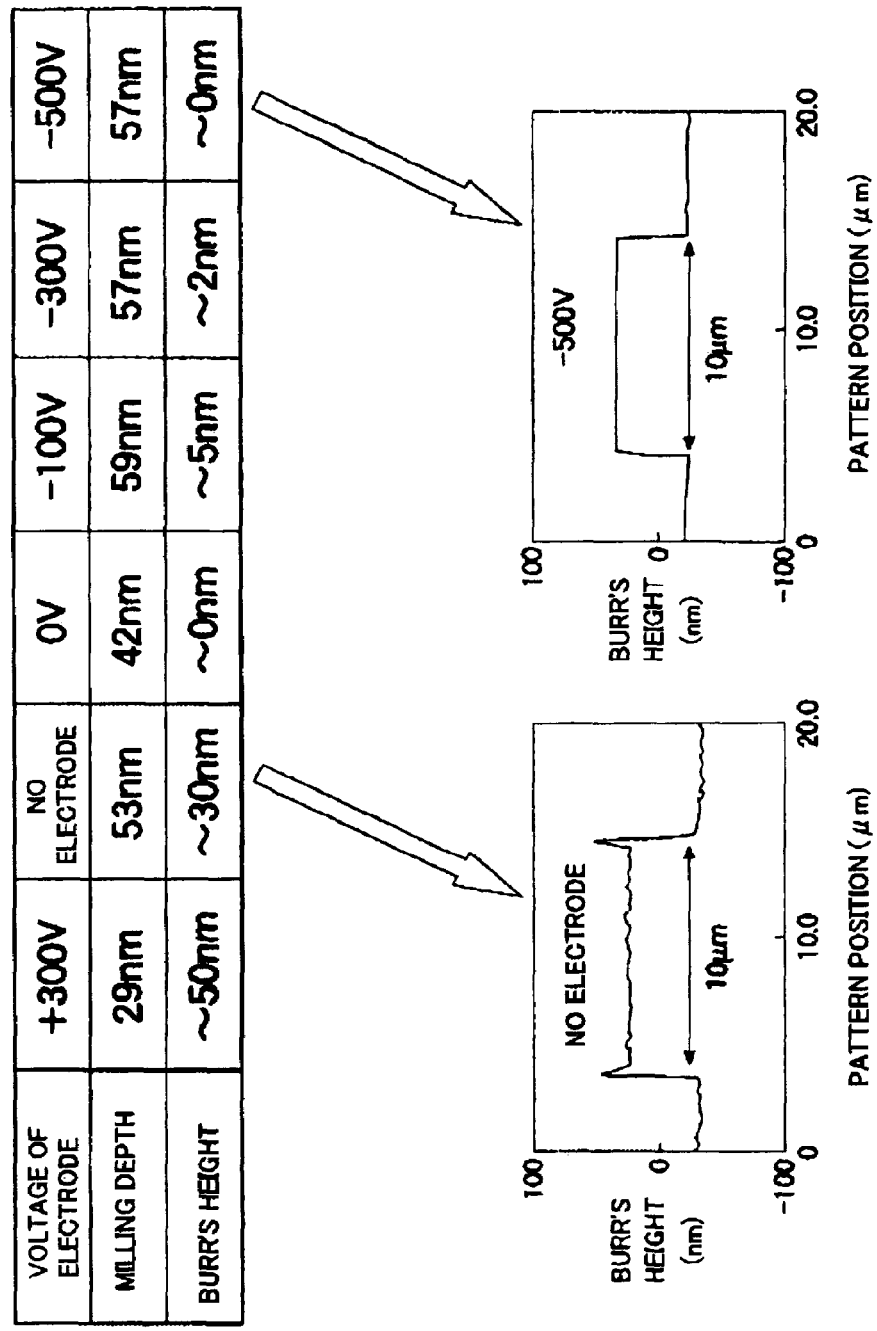
FIG. 10 is a view for explaining the effect of application of an electric field by the electrode of the present invention.

As shown in FIG. 10, while there was a difference of 30 nm to 60 nm in the amount (depth) of milling, at a voltage of 0V to negative voltage, the occurrence of burrs is suppressed. With a positive (+) potential, burrs increase and the effect of the present embodiment are supported from the opposite standpoint. Specifically, in the no electrode state, the height of the burr was 30 nm or so. On the one hand, with a voltage applied to the electrode of 0V to negative voltage, the height of the burr was 5 nm even at a maximum or a state with almost no burr formation. On the other hand, when applying a positive (+) voltage to the electrode, the height of the burr reaches as much as 50 nm or higher than the height of the burr in the case of no electrode. In this way, the result of suppression of burr formation is not that dependent on the magnitude of the voltage applied to the electrode. A sufficient effect is obtained by a slight negative potential (including zero potential).

Next, the state of occurrence of burrs when making the resist pattern a plate-shaped pattern of a thickness of 250 nm and a width of 10 μm and milling a multilayer film obtained by successively forming on a substrate, silicon oxide (SiO$_2$) film, a chrome (Cr) film of a thickness of 10 nm, a cobalt (Co) film of a thickness of 120 nm, and a gold (Au) film of a thickness of 20 nm was evaluated while changing the magnitude of the voltage applied to the electrode. The results will be explained with reference to FIG. 11. Note that the conventional ion beam processing conditions correspond to the "no electrode" column in the table. Here, "no electrode" means the state where the electrode is electrically floating (not grounded) or the state where no electrode is provided. Further, the tilt angle of the ion beam was made −5 degrees and the distance between the electrode and the processed sample was made 7 mm.

Figure 11:
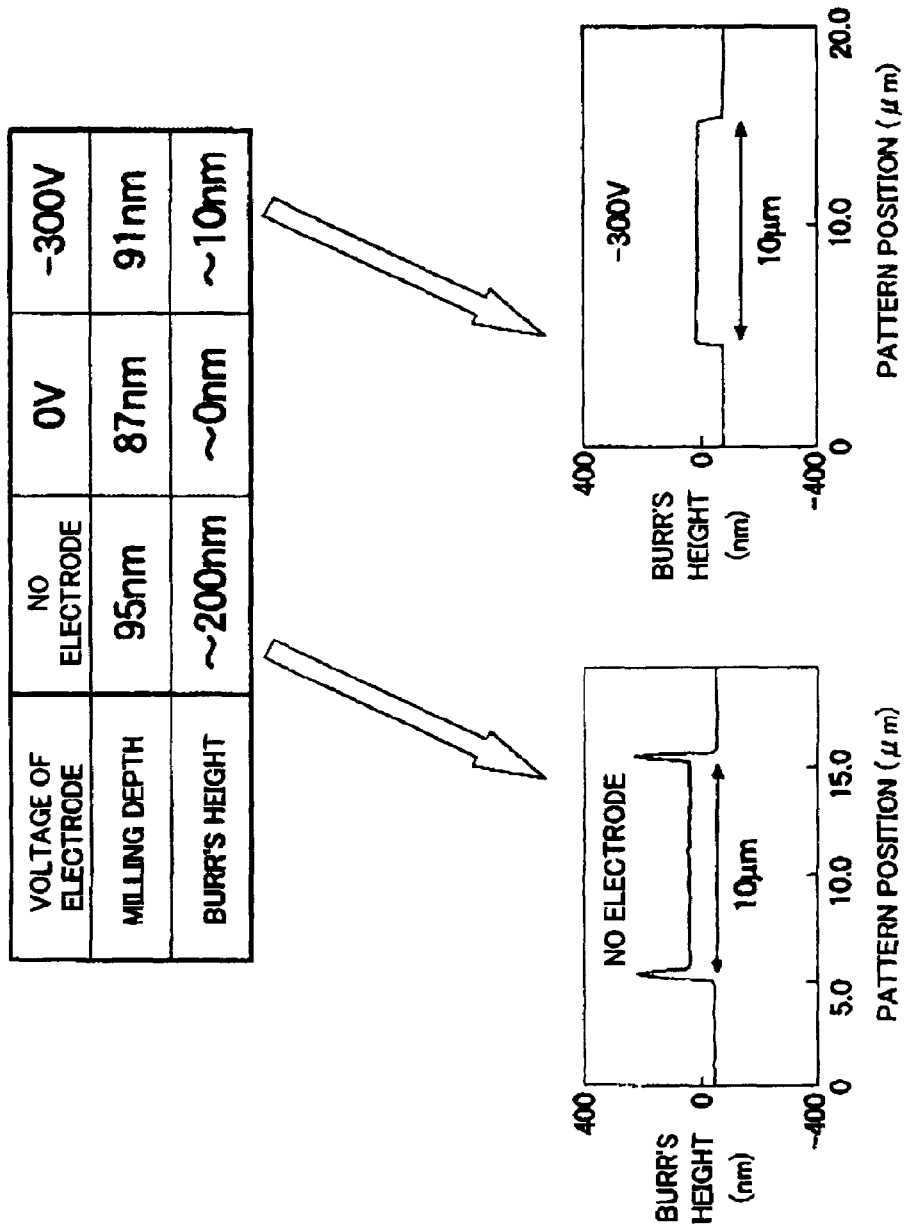
FIG. 11 is a view for explaining the effect of application of an electric field by the electrode of the present invention.

As shown in FIG. 11, the amount (depth) of milling was a large 90 nm to 100 nm, so the burr formed with the conventional milling ("no electrode") reached as high as 200 nm. However, by applying the ion beam processing according to the ion beam processing system of the present invention, in the same way as explained with reference to FIG. 10, almost no burr was produced or even if produced was less than 10 nm. The occurrence of burrs was greatly suppressed. In this example as well, the effect of suppression of the formation of burrs is not that dependent on the magnitude of the voltage supplied to the electrode. A sufficient effect is obtained by a slight negative potential (including zero potential).

Next, the state of occurrence of burrs when making the resist pattern a plate-shaped pattern of a thickness of 350 nm and a width of 10 μm and milling a multilayer film obtained by successively forming on a substrate, silicon oxide (SiO$_2$) film, a cobalt (Co) film of a thickness of 120 nm and a gold (Au) film of a thickness of 20 nm was evaluated while changing the magnitude of the voltage applied to the electrode. The results will be explained with reference to FIGS. 12A to 12F. Note that the conventional ion beam processing conditions correspond to the "no electrode". Here, "no electrode" means the state where the electrode is electrically floating (not grounded) or the state where no electrode is provided. In the example explained using FIG. 11, the resist thickness was 250 nm and the milling was performed to 100 nm. In this case, the residual thickness of the resist film becomes smaller and liftoff becomes difficult, so this is not preferable milling process. Accordingly, in this example, the thickness of the resist was increased to 350 nm and about 100 nm of milling was performed. Further, the tilt angle of the ion beam was made −5 degrees and the distance between the electrode and the processed sample was made 7 mm.

Figure 12A:
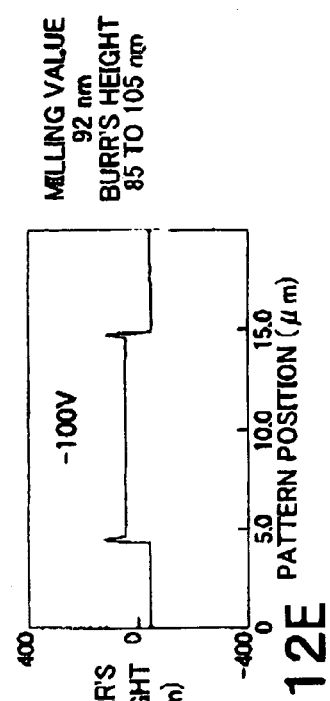
FIGS. 12A to 12F are views of the shapes of burs for explaining the affect of application of an electric field by the electrode of the present invention.
Figure 12B:
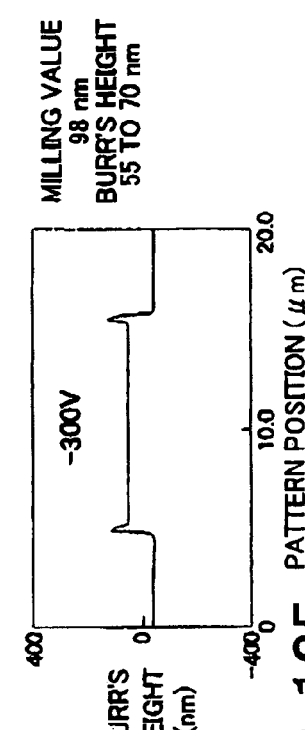
Figure 12C:
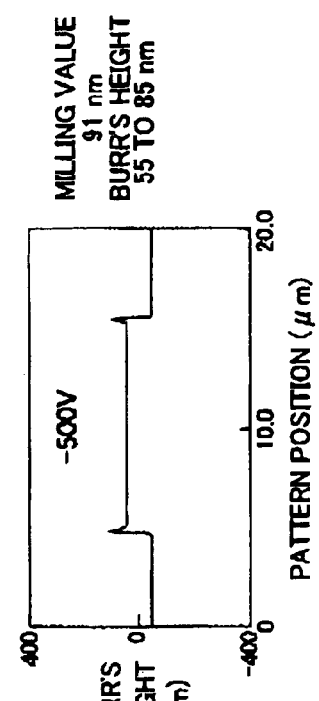
Figure 12D:
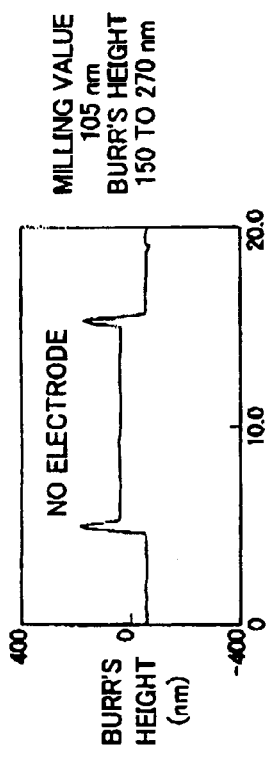
Figure 12E:
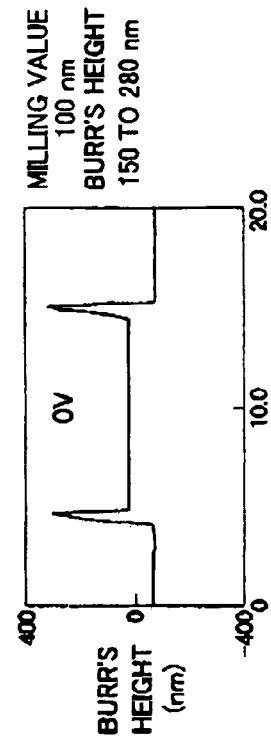
Figure 12F:
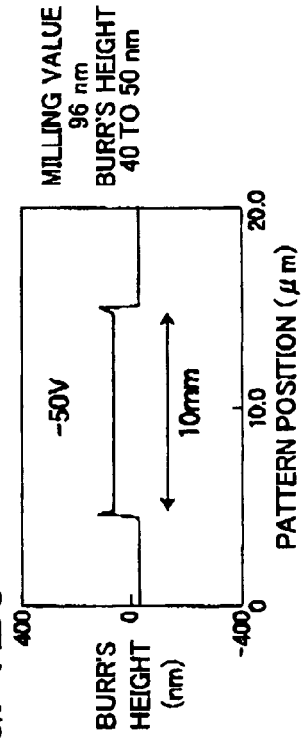

As shown in FIGS. 12A to 12F, in this example, no effect of suppression of burrs is obtained at zero potential. With application of a negative potential, however, the height of the burr became a fraction of that of the conventional method. Looking at this in more detail, while the amount of milling varies, as shown in FIG. 12A, in the case of "no electrode", the height of the burr became 150 nm to 270 nm. Further, as shown in FIG. 125, when the potential of the electrode was 0V, the height of the burr became 150 nm to 250 or no improvement. On the other hand, when the potential of the electrode was negative, for example, as shown in FIG. 12C, in the case of −50V, the height of the burr became 40 nm to 50 nm; as shown in FIG. 12D, in the case −100V, the height of the burr became 85 nm to 105 nm; as shown in FIG. 12E, in the case −300V, the height of the burr became 55 nm to 70 nm; and as shown in FIG. 12F, in the case −500V, the height of the burr became 55 nm to 85 nm. In this example, while it was not possible to reduce the burrs to substantially zero like in the example explained by FIG. 11 (thickness of resist film of 250 nm), a sufficient effect of suppression of the occurrence of burrs was obtained in practice.

Next, the state of occurrence of burrs when making the resist pattern a dot pattern of a thickness of 350 nm and a diameter of 1.6 μm and milling a multilayer film obtained by successively forming on a substrate (silicon oxide (SiO$_2$) film) a chrome (Cr) film of a thickness of 10 nm, a cobalt (Co) film of a thickness of 120 nm, and a gold (Au) film of a thickness of 20 nm was evaluated while changing the magnitude or the voltage applied to the electrode. The results will be explained with reference to FIGS. 13A to 13F. Note that the conventional ion beam processing conditions correspond to the "no electrode". Here, "no electrode" means the state where the electrode is electrically floating (not grounded) or the state where no electrode is provided. In FIGS. 13A to 13F, to facilitate understanding, 3D AFM images are shown. Further, the tilt angle or the ion beam was made −5 degrees and the distance between the electrode and the processed sample was made 7 mm.

Figure 13A:
FIGS. 13A to 13F are photographs for explaining the effect of application of an electric field by the electrode of the present invention.
Figure 13B:
Figure 13C:
Figure 13D:
Figure 13E:
Figure 13F:

As shown in FIGS. 13A to 13F, burrs formed in rings around the dots (for example, in volcano rim shapes). However, by applying a negative potential to the electrode, however, the heights of the burrs were reduced to ½ to ⅓. Explaining this in more detail, while the amounts of milling differed, as shown in FIG. 13A, in the case of "no electrode", the height of the burr reached as much as 200 nm. Further, as shown in FIG. 13B, in the case of a potential of the electrode of 0V, the height of the burr reached 180 nm or no improvement. On the other hand, when the potential of the electrode was negative, for example, as shown in FIG. 13C, in the case of −50V, the height of the burr became 50 nm to 70 nm; as shown in FIG. 13D, in the case −100V, the height of the burr became 90 nm to 150 nm; as shown in FIG. 13E, in the case −300V, the height of the burr became 70 nm to 90 nm; and as shown in FIG. 13F, in the case −500V, the height of the burr became 70 nm to 90 nm. It is learned that with a dot-shaped mask, while the effect of suppression of the occurrence of burrs falls, from the 3D drawings, it can be seen that the application of a negative potential to the electrode reduces the height of the burr and the thickness of the burr to a fraction otherwise. This is an important effect of the present invention. In terms of the volume of the burr, it was reduced about one order of magnitude. Again, the effect of the present invention is clearly visible.

Figure 14:
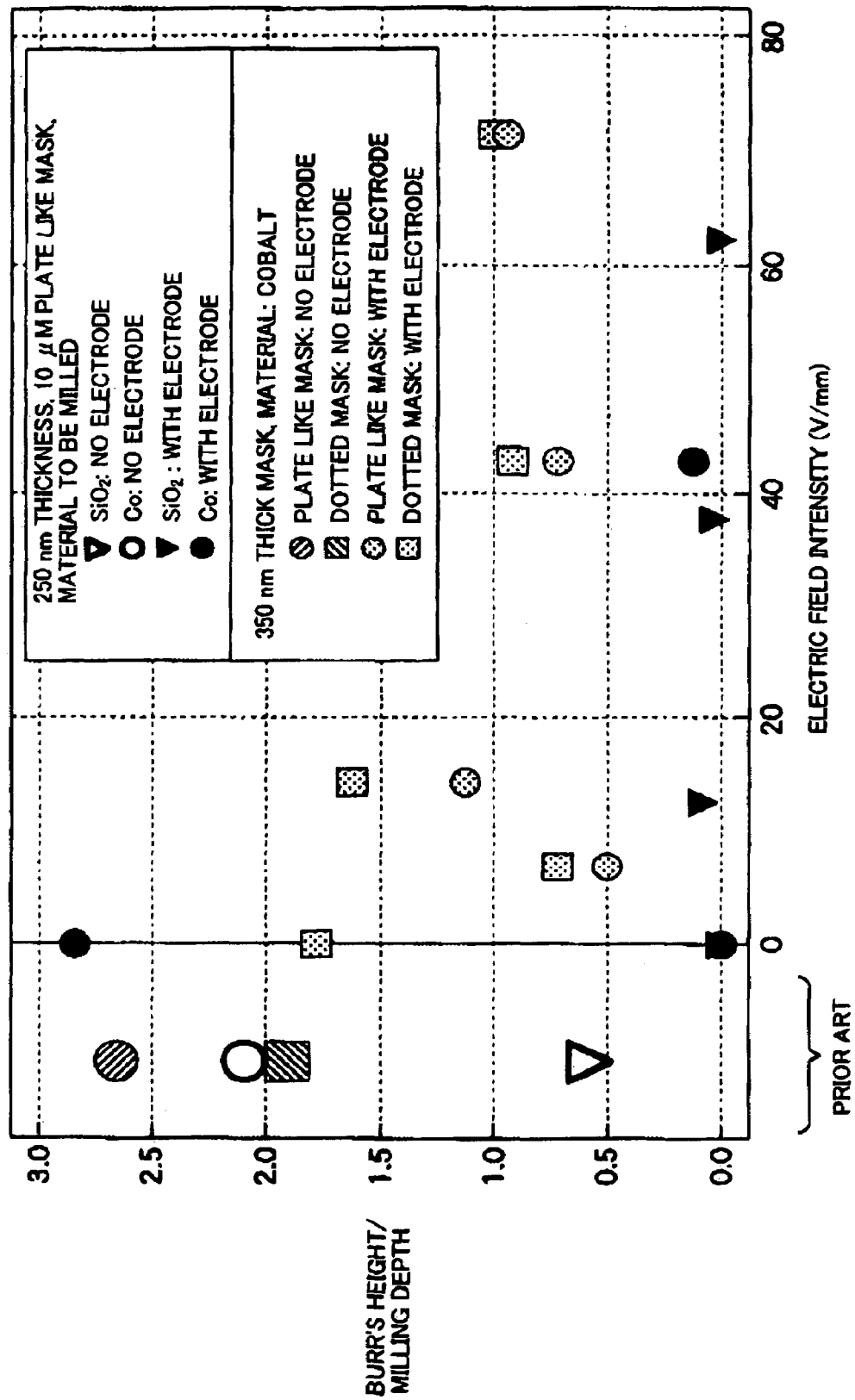
FIG. 14 is a view of the relationship between the height of burrs defined by the milling height and the field strength.

The results explained with reference to FIG. 10 to FIGS. 13A to 13F are summarized in FIG. 14 showing the relationship between the height of the burrs as defined by the milling depth and the field strength. Compared with the related art not using an electrode, it is learned that an electrode to which a negative potential is applied (presence of an electrode) suppresses or prevents the formation of burrs. Further, when the field strength is at the negative side from a certain value, for example, −20V/mm, the height of the burr defined by the milling depth becomes substantially constant under all conditions.

Second Embodiment

Figure 15A:
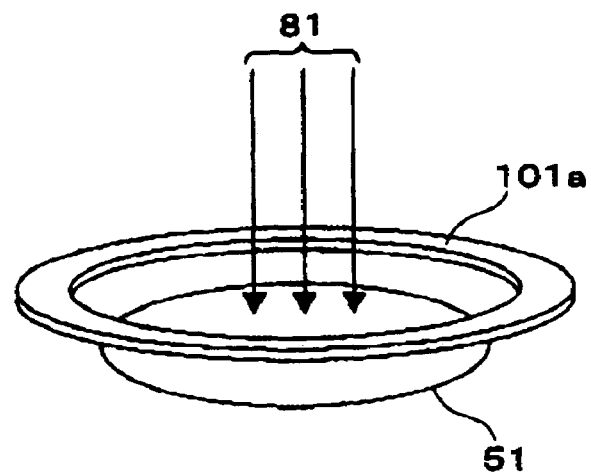
FIGS. 15A to 15C are schematic perspective views of embodiments of the shapes of electrodes according to the ion beam processing system and ion beam processing method of the present invention.
Figure 15B:
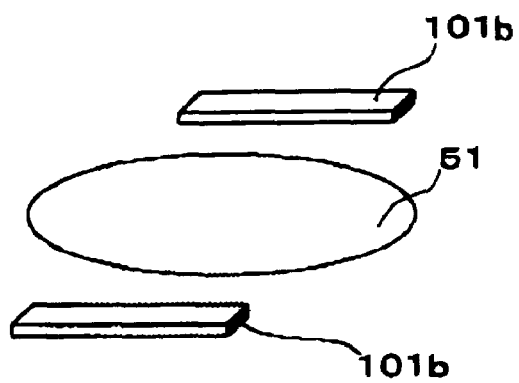
Figure 15C:
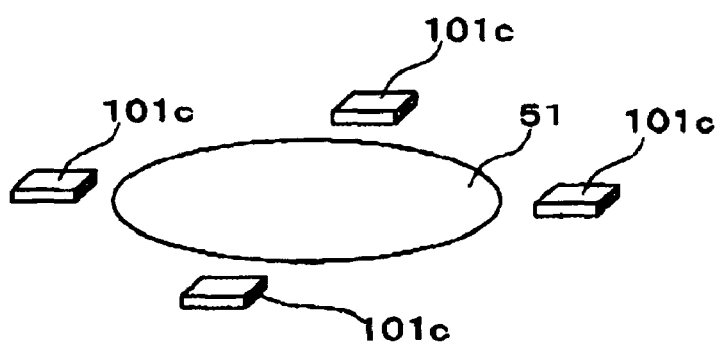

Next, the shape of the electrode will be explained by the schematic perspective views of configuration of FIGS. 15A to 15C. In the above embodiment, the electrode used was made a ring-shaped one, but it is also possible to use various other shapes of electrodes of good efficiency in accordance with the size of the sample substrate and the processed area. FIGS. 15A to 15C show cases of arrangement or the electrode outside of the processed sample.

As shown in FIG. 15A, a ring- and plate-shaped electrode 111a is arranged above the processed sample 51 so as not to block the ion beam 81 fired at the processed sample 51. Further, as shown in FIG. 15B, it is also possible to arrange a plurality of plate-shaped electrodes 101b at the sides of the processed sample 51.

In this figure, the example of arranging two plate-shaped electrodes 101b symmetrically across the processed sample 51 is shown, but it is also possible to arrange three or four electrodes around it. In this case, the electrodes have to be arranged so as to generate a uniform electric field over the entire processed sample 51. As one example, electrodes 101b may be arranged point symmetrically at equal intervals around the processed sample 51. Further, as shown in FIG. 15C, it is possible to arrange a plurality of chip-shaped electrodes 101c at the sides of the processed sample 51. In this figure, the example of arranging four chip-shaped electrodes 101c point symmetrically at equal intervals around the processed sample 51 is shown, but it is also possible to arrange two or three or five or more. Further, while not shown in FIGS. 15A to 15C, the electrodes may also be not plate shapes, but wire-like ring shapes or simply electrical conductors formed into rings. In each case, it is necessary that the electrodes be of shapes and dimensions so as not to block the fired ion beams and enable the processed sample to be uniformly exposed to the ion beams.

Third Embodiment

Next, the position of arrangement of the electrode (position relative to processed sample in direction of incidence of ion beam) will be explained with reference to the schematic view of the configuration of FIGS. 16A to 16D. Here, the case is shown of the arrangement of a ring-shaped electrode at the outside of the processed sample 51. Note that even in the case of plate-shad electrodes and chip-shaped electrodes, arrangement in a positional relationship with respect to the processed sample similar to that of the ring-shaped electrode is possible. Note that the arrow from the processed sample 51 to the electrode 101 in FIGS. 16B to 16D shows the electrical force lines.

Figure 16A:
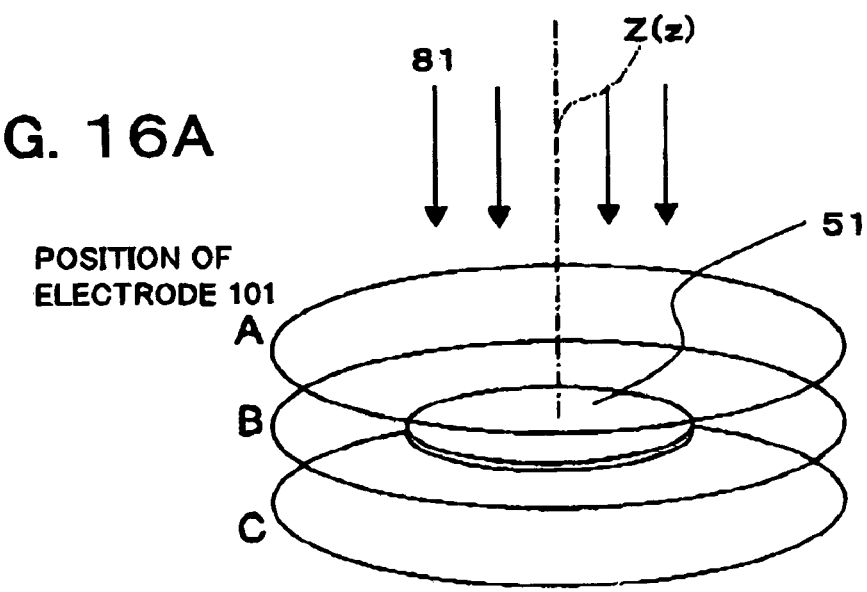
FIGS. 16A to 16D are schematic views of embodiments of the positions of arrangement of electrodes according to the ion beam processing system and ion beam processing method of the present invention.
Figure 16B:
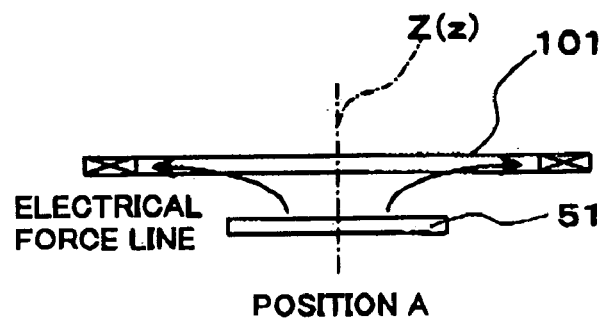
Figure 16C:
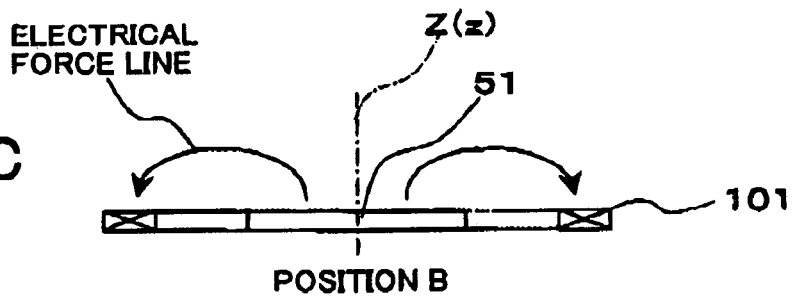
Figure 16D:
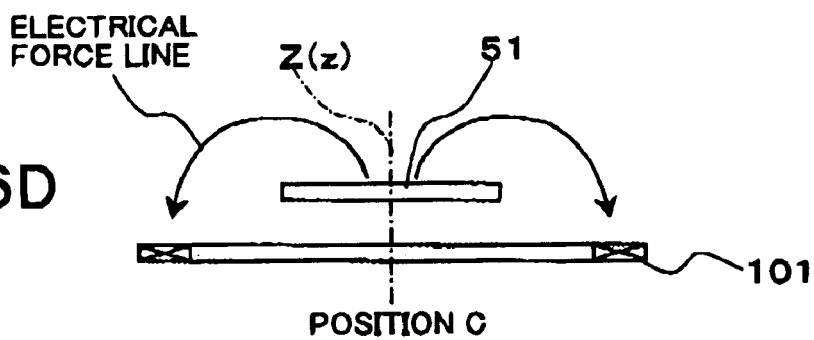

As shown in FIGS. 16A and 16B, the electrode 101 can be arranged above the processed surface of the processed sample 51 (side of incidence of ion beam 81) so as to enable the ion beam 81 to pass through the inside part of the electrode 101. In this case, it is preferable that it be arranged so that the center axis Z of the processed sample 51 and the center axis z of the ring-shaped electrode 101 be aligned. Further, as shown in FIG. 16C, the electrode 101 can be arranged at the sides of the processed sample 51 so that the processed sample 51 is arranged in the inside part of the electrode 101 with clearance. In this case, it is preferable that it be arranged so that the center axis Z of the processed sample 51 and the center axis z of the ring-shaped electrode 101 be aligned. Further, as shown in FIG. 16D, the electrode 101 can be arranged below the processed surface of the processed sample 51 (side opposite to side of incidence of ion beam 81) and so that the projection of the processed sample 51 not overlap the electrode 101. In this case, it is preferable that it be arranged so that the center axis Z of the processed sample 51 and the center axis z of the ring-shaped electrode 101 be aligned.

In this way, the electrode 101 does not have to be positioned vertically with respect to the processed sample 51 so as to be above the processed surface of the processed sample 51 (side of incidence of ion beam). It may also be positioned at the same height as the processed surface or below the processed surface in some cases. It is sufficient that there be an electric field in the space above the processed surface. Therefore, it is sufficient that there be an electrode near the processed sample 51. However, if the effective distance between the center of the processed sample 51 and the electrode 101 (length of electrical lines of force) becomes long, the field strength at the center of the processed sample 51 will become lower than that at the periphery of the processed sample 51. If the size of the processed sample 51 becomes large, it will be necessary to consider uniformity of the electric field distribution, so the electrode 101 should be arranged above the processed surface. Note that when the stage 21 is configured to be elevatable, it is preferable to provide the electrode 101 at the sides of or below the processed sample 51 so as not to interfere with the vertical motion of the stage 21. If not interfering with the vertical motion of the stage 21, however, the electrode 101 is preferably arranged above the processed sample 51.

Fourth Embodiment

Figure 17:
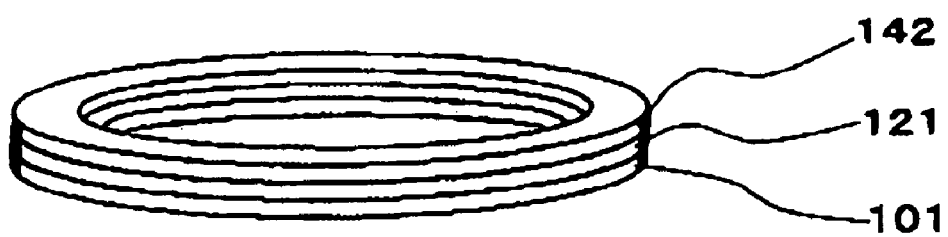
FIG. 17 is a schematic perspective view of an embodiment of the shape of an electrode according to the ion beam processing system and ion beam processing method of the present invention.

Next, the structure of the cover of the electrode will be explained. The cover of the electrode should be positioned to shield the electrode from the ion beam. As explained with reference to FIG. 5, the cover 141 may be configured to be arranged at a position away from the electrode 101 by the insulators 131 at the side of the electrode 101 where the ion beam would strike. In another configuration, as shown in FIG. 17, the electrode 101 and a cover 142 may be formed integrally through an insulating layer 121. This integrated electrode/cover structure may be obtained by bonding together the electrode 101, insulating layer 121, and cover 142 or by forming films on a suitable substrate material by a thin film process.

Fifth Embodiment

Next, examples of the shapes of electrodes formed integrally with covers will be explained with reference to the schematic perspective views of configuration of FIG. 10 and FIGS. 19A to 19H.

Figure 18:
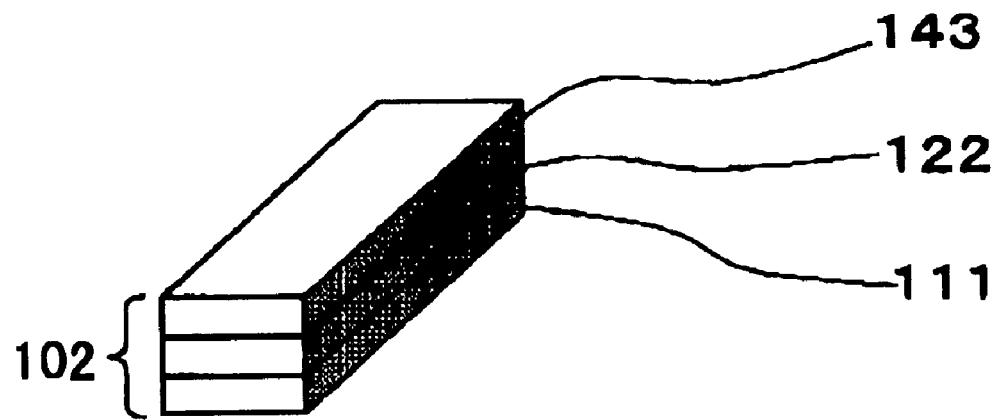
FIG. 18 is a perspective sectional view of an embodiment relating to the cover structure of the electrode.

As shown in FIG. 18, the number of variations of electrode shapes can be increased by forming a cover layer 143 over a wire-shaped electrode conductor 111 via an insulating layer 122, that is, an integral structure of an electrode conductor and cover. With this structure, as shown in FIG. 18 and FIGS. 19A to 19H, since the electrode 102 can be formed as a thin wire, even if the electrode 102 is arranged above the processed sample 51, that is, at the side where the ion beam strikes, the ion beam will not be blocked much at all and the electrode 102 will not form a shadow on the processed surface of the processed sample 51. Further, the electrode 102 can be arranged in a direction perpendicular to the processed surface of the processed sample 51, that is, in the area where the ion beam strikes, so the field density in the space contiguous with the processed surface becomes higher and consequently the effect of suppression of burrs can be enhanced.

Next, various examples of the shapes of the electrode 1021 to 1028 will be explained with reference to FIGS. 19A to 19H. All of the electrodes attached to the ion beam processing system 1 of the present invention (see FIG. 4 and FIG. 5) shown in FIGS. 19A to 19H are formed by integral structure thin wires, for example, wires of a width of about 1 mm.

Figure 19A:
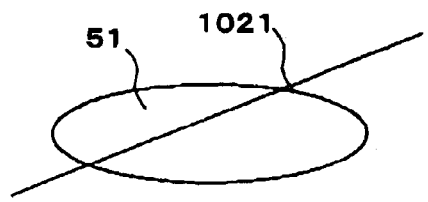
FIGS. 19A to 19H are schematic perspective views of examples of the configuration of the electrode.

The electrode 1021 shown in FIG. 19A is comprised of a single straight wire arranged in the diametrical direction above (ion beam incidence side) the processed sample 51.

Figure 19B:
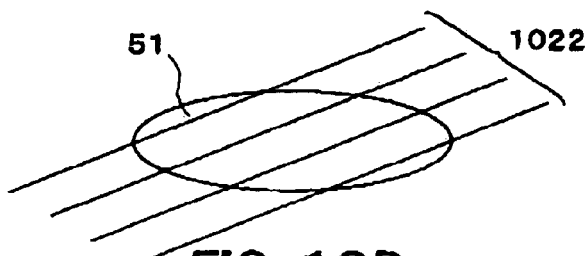

The electrode 1022 shown in FIG. 19B is comprised of a plurality of straight wires (for example, in the figure, four wires) arranged in parallel to each other at equal distances from the processed surface of the processed sample 51 above (ion beam incidence side) the processed sample 51.

Figure 19C:
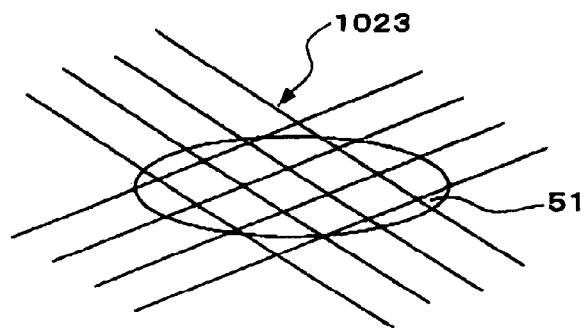

The electrode 1023 shown in FIG. 19C is comprised of pluralities of straight wires (for example, in the figure, groups of four wires) arranged perpendicularly to each other at equal distances from the processed surface of the processed sample 51 above (ion beam incidence side) the processed sample 51. That is, the wires forming the electrode are arranged in a lattice.

Figure 19D:
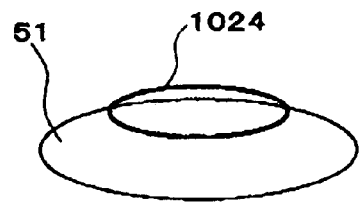

The electrode 1024 shown in FIG. 19D is comprised of a single wire shaped into a ring arranged in parallel with and above (ion beam incidence side) the processed sample 51.

Figure 19E:
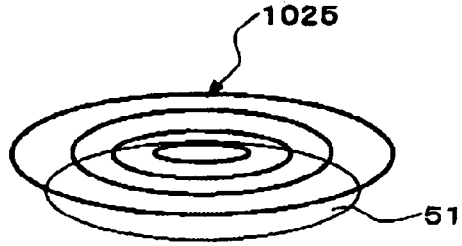

The electrode 1025 shown in FIG. 19E is comprised of a plurality of wires (for example, in the figure, four wires) shaped into rings arranged concentrically in parallel with and at equal distances from the processed surface of the processed sample 51 above (ion beam incidence side) the processed sample 51.

Figure 19F:
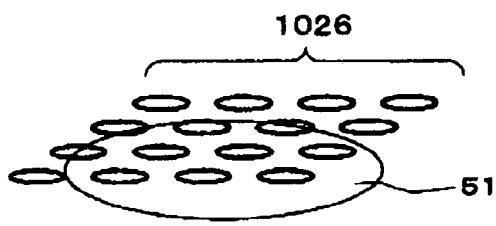

The electrode 1026 shown in FIG. 19F is comprised of a plurality of wires (for example, in the figure, 16 wires) shaped into rings arranged in a matrix in parallel with and at equal distances from the processed surface of the processed sample 51 above (ion beam incidence side) the processed sample 51.

Figure 19G:
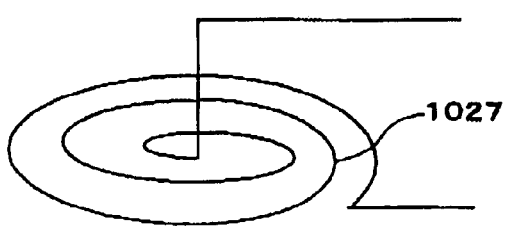

The electrode 1027 shown in FIG. 19G is comprised of a single wire shaped into a spiral arranged in parallel with and at an equal distance from the processed surface of the processed sample 51 above (ion beam incidence side) the processed sample 51.

Figure 19H:

The electrode 1028 shown in FIG. 19H is comprised of a single wire bent into a zigzag shape arranged in parallel with and at an equal distance from the processed surface of the processed sample 51 above (ion beam incidence side) the processed sample 51.

Figure 20:
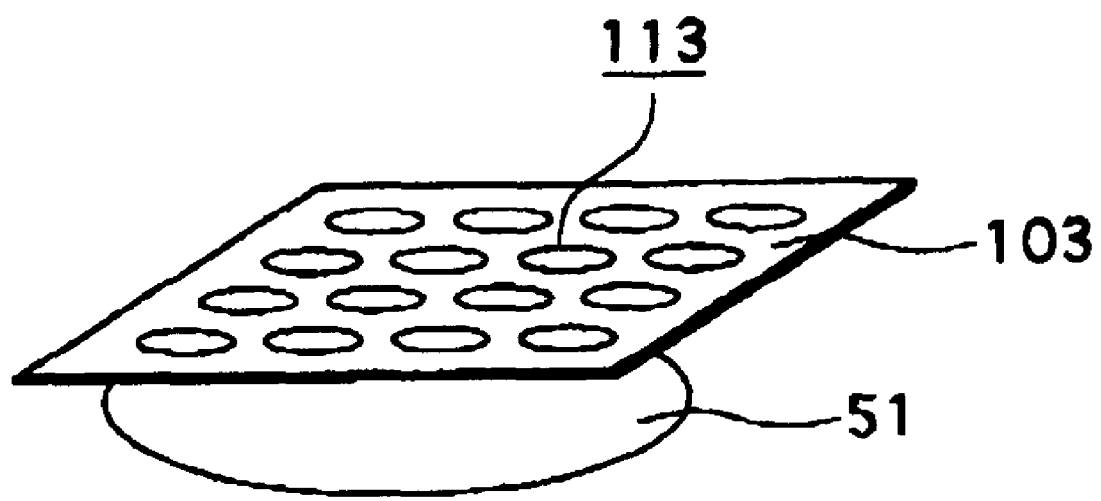
FIG. 20 is a schematic perspective view of an example of an unpreferable electrode shape.

Next, an example of a not preferred shape of the electrode will be explained with reference to FIG. 20. As shown in FIG. 20, this is a plate-shaped electrode 103 provided with a plurality of holes 113 and arranged above the processed sample 51 (ion beam incidence side). In this configuration of electrode 103, most of the ion beam fired at the processed sample 51 strikes the electrode 103. The electrode 103 blocks much of the ion beam so that it no longer reaches the surface of the processed sample 51. Therefore, uneven ion beam processing results and high precision ion beam processing becomes difficult. However, if the sizes of the holes are sufficiently large with respect to the plate-shaped electrode, that is, the area of the openings is sufficiently large compared with the remaining area of the base material, then the electrode will come to resemble the lattice-like electrode shown in FIGS. 19C and 19F and will become usable.

In each of the configurations of electrodes explained by FIGS. 19A to 19H, the electrode has to be of a shape and dimensions sufficiently for securing a region for passage of the ion beam so that the ion beam can be uniformly irradiated over the processed surface of the processed sample 51. If the area of the region for passage is small, a shadow of the electrode will be cast over the processed sample 51 and the electric field near the electrode may cause the ion beam to be deflected and accelerated. That is, the electrode will end up acting as a type of grid. Further, the electron beam is neutralized to a certain extent by the electrons from the electron generator (see FIG. 4), but there has to be a suitable distance between the electrode and beam when passing through the electrode. Accordingly, the width of electrode wires is preferably made not more than 1 mm or so. Further, the density of the electrode wires is preferably made not more than 5 wires/cm$^2$.

Further, the generation of the electric field near the processed surface has no effect on the milling rate in the range of the above embodiments. That is, no effect is seen on the ion beam due to the presence of the electrode or electric field.

Ion beam processing systems come in various types depending on the differences in the ion source (ion gun), electron generator (neutralizer), stage holding the processed sample, and other mechanisms, but are the same in the basic action of accelerating and firing an argon ion beam to strike a processed surface and shave parts of the surface away. Therefore, the present invention can be applied to any of these types of ion beam processing systems. Further, the present invention can also be effectively applied to reactive ion etching (RIE) using chemical action. While there is a difference of degree, there is a physical etching (sputtering) action due to the etching species (various ions) striking the processed surface with kinetic energy and therefore there is a problem with the occurrence of burrs similar to ion beam processing.

As explained above, the ion beam processing system and ion beam processing method of the present invention arrange an electrode having a negative potential (or 0V potential) near the processed surface of a processed sample to generate an electric field between the electrode and processed sample, deflect the direction of emission of the sputtered atoms (positive (+) ions) of the processed sample upward (ion beam incidence side), and thereby prevent redeposition of the sputtered atoms (particles) to the mask and processed surface. Further, in ion milling or reactive ion etching (RIE) accompanied with a physical sputtering effect as well, formation of burrs deposited around the masks is prevented by the present invention, so there are the effects that (1) short-circuits between multilayer films after processing due to occurrence of burrs can be suppressed, (2) the side faces of the resist mask are not covered by redeposits (burrs) and therefore liftoff can be remarkably improved, (3)

residual resist easily occurring at the roots of the burrs can be eliminated, (4) sizes of openings of contact holes can be obtained as designed even in microdevices, (S) burrs do not grow even with miniaturization of mask size, so processing of microshapes of the submicron order is possible, (6) there is no need to tilt the sample surface for ion beam processing to remove burrs, so tapering of the processed sectional profile can be suppressed, etc.

The ion beam processing system and ion beam processing method of the present invention can be applied to fabrication of various types of memories, processors, transistors, and storage device components (magnetic heads etc.) in the information communication industry. Further, they may be applied to the fabrication of micromechanical devices known as "micro electro mechanical systems (MEMS)".

While the invention has been described with reference to specific embodiments chosen for purpose of illustration, it should be apparent that numerous modifications could be made thereto by those skilled in the art without departing from the basic concept and scope of the invention.

We claim:

1. An ion milling apparatus comprising:
   a stage for mounting a sample to be processed;
   an ion source for emitting an Ar gas ion to the sample;
   an electron generator, positioned between the ion source and the stage, for emitting neutralization electrons for neutralizing ions scattered from the sample emitted by the inert gas ion;
   an electrode positioned adjacent to the sample and between the electron generator and the sample; and
   a power source for supplying a voltage of equal to or lower than 0 Volts, to the electrode, the electrode being configured to generate on electric field near the sample for directing the ions scattered from the sample to a direction and/or a position where the neutralization electrons emitted from the electron generator exist.

2. The ion milling apparatus as set forth in claim 1, further comprising:
   a chamber accommodating the stage, the ion source, the electron generator, and the electrode; and
   an evacuation pump configured to exhaust the gas inside the chamber.

3. The ion milling apparatus as set forth in claim 2, wherein the ion source comprises an ion acceleration unit configured to accelerating the emitted Ar gas ion.

4. The ion milling apparatus as set forth in claim 2, further comprising a cover positioned between the electron generator and the electrode and having a potential for preventing the ion beam directing the sample from directly striking the electrode.

* * * * *

UNITED STATES PATENT AND TRADEMARK OFFICE
CERTIFICATE OF CORRECTION

PATENT NO. : 7,288,173 B2  
APPLICATION NO. : 10/928832  
DATED : October 30, 2007  
INVENTOR(S) : Akio Fukushima and Kojiro Yagami It is certified that error appears in the above-identified patent and that said Letters Patent is hereby corrected as shown below:

On the Title Page

Item (73) Assignee: Sony Corporation, Tokyo (JP); National Institute of Advanced Industrial Science and Technology, Tokyo (JP) should be --National Institute of Advanced Industrial Science and Technology, Tokyo, (JP); Sony Corporation, Tokyo (JP)--

Signed and Sealed this

Fifteenth Day of April, 2008

JON W. DUDAS  
*Director of the United States Patent and Trademark Office*